(12) United States Patent
Yao et al.

(10) Patent No.: US 12,493,242 B2
(45) Date of Patent: Dec. 9, 2025

(54) FABRICATION OF MICRO/NANO-FLUIDIC CHANNELS THROUGH ULTRAVIOLET PATTERNING

(71) Applicant: FACEBOOK TECHNOLOGIES, LLC, Menlo Park, CA (US)

(72) Inventors: Li Yao, Redmond, WA (US); Priyanshu Agarwal, Kirkland, WA (US); Daniel Myers, Kirkland, WA (US); Thomas John Farrell Wallin, Redmond, WA (US); Serol Turkyilmaz, Kirkland, WA (US); Yigit Menguc, Pittsburgh, PA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 581 days.

(21) Appl. No.: 17/722,277

(22) Filed: Apr. 15, 2022

(65) Prior Publication Data

US 2022/0342304 A1    Oct. 27, 2022

Related U.S. Application Data

(60) Provisional application No. 63/175,234, filed on Apr. 15, 2021.

(51) Int. Cl.
| | |
|---|---|
| *G03F 7/035* | (2006.01) |
| *B82Y 40/00* | (2011.01) |
| *C08L 75/06* | (2006.01) |
| *G03F 1/50* | (2012.01) |
| *G03F 7/00* | (2006.01) |
| *G03F 7/095* | (2006.01) |

(52) U.S. Cl.
CPC .............. *G03F 7/035* (2013.01); *C08L 75/06* (2013.01); *G03F 1/50* (2013.01); *G03F 7/0002* (2013.01); *G03F 7/095* (2013.01); *B82Y 40/00* (2013.01)

(58) Field of Classification Search
CPC .......... G03F 7/035; G03F 1/50; G03F 7/0002; G03F 7/095; G03F 7/027; G03F 7/0275; G03F 7/038; G03F 7/2014; C08L 75/06; C08L 75/16; B82Y 40/00; C08G 18/6715; C08G 18/672; C08G 18/8166; C08G 18/875

See application file for complete search history.

(56) References Cited

U.S. PATENT DOCUMENTS

| | | |
|---|---|---|
| 6,686,184 B1 | 2/2004 | Anderson et al. |
| 2002/0004182 A1 | 1/2002 | McReynolds |
| 2012/0105534 A1 | 5/2012 | Boday et al. |

OTHER PUBLICATIONS

U.S. Appl. No. 63/163,603, unpublished, filed Mar. 19, 2021.

*Primary Examiner* — Jessica M Roswell
(74) *Attorney, Agent, or Firm* — McDermott Will & Schulte LLP

(57) ABSTRACT

Methods for making a B-stage thiol-cured urethane acrylate elastomeric film are provided. At least a urethane acrylate oligomer, a multifunctional thiol, and a base catalyst are combined to form a thiol terminated B-stage elastomer. The thiol terminated B-stage elastomer is exposed to an ultraviolet photoinitiator in the presence of an allyl ether terminated urethane to form the B-stage thiol-cured urethane acrylate elastomeric film. In some embodiments the B-stage thiol-cured urethane acrylate elastomeric film is used for a soft actuator application such as a fluidic elastomer actuator application or an electrostatic zipping actuator application.

20 Claims, 5 Drawing Sheets

FABRICATION OF MICRO/NANO-FLUIDIC CHANNELS THROUGH ULTRAVIOLET PATTERNING

CROSS-REFERENCE TO RELATED APPLICATIONS

The present application claims priority to U.S. Provisional Patent Application No. 63/175,234, filed Apr. 15, 2021, the contents of which is incorporated herein in its entirety.

FIELD

Described herein are methods for fabricating nano- and micro-size inflatable four-dimensional fluidic channels based on ultraviolet patterning of B-stage elastomeric films.

BACKGROUND

To enhance soft actuator performance, there is increasing demand for the development of new assembly technologies. For example, reducing the bond width while enhancing bonding strength can increase the density of fluidic channels or other components in haptic actuators; reducing the thickness of the total electrostatic zipping actuator by avoiding additional adhesive layers can efficiently reduce the required voltage while maintaining or increasing the output force.

Conventional haptic actuators, particularly zipping based actuators, are frequently fabricated from silicones due to their low elastic modulus and high elongation. To bond two elastomeric films/membranes made of silicone together, it usually requires additional adhesive layers that will increase the thickness of the total device. Moreover, such silicone layers are difficult to bond with adhesives, owing in part to their low surface energy and hydrophobicity. Further still, for an electrostatic zipping actuator, the increased thickness owing to the additional adhesive layers reduces the output force or increases the input voltage.

Thus, what is needed in the art are stretchable and cure-on-demand elastomeric films. Such films can be used to make actuators. Moreover, improved methods for tunable optical performance of tunable optical displays is needed.

SUMMARY

The present disclosure addresses the identified shortcomings in the prior art. Using the unique chemistry of the B-stage elastomer, laser interference lithography, wafer aligning techniques, and design of fluidic actuators, haptic performance can be further expanded to improve the resolution of the sensation and provide additional dimension of sensation, that is adhesion. Those improvements are difficult to be achieved using current materials and processes. The present disclosure provides methods for fabricating nano- and micro-size inflatable four-dimensional fluidic channels based on ultraviolet patterning of B-stage elastomeric films.

Applications of these micro-/nano-size four-dimensional fluidic channels include complex soft fluidically actuated haptic displays, customizable surface texture, tunable physical bonding and tunable optical displays.

Haptic displays. The ability to create complex pattern of micro/nano four-dimensional fluidic channels provided in the present disclosure enable the development of ultra-stretchable high density bubble array actuators that provide ultrafine tactile pressure feedback to the user, which is useful to simulate object edges and texture in virtual reality. Since the disclosed methods allow for the flexibly to tune channel size, channels of varying size can be easily fabricated within the same base substrate, which can act as actuators by themselves. Furthermore, the disclosed methods can be scaled to design multi-layer actuators where each layer is selectively cured using a mask and delivers a specific type of haptic sensation or achieves higher overall actuator displacement. The stretchability of these actuators improves their wearability, while the improved resolution of the inflatable/zippable channels increases the detailed sensation of the haptic feedback.

Customizable surface texture. The presence of texture on soft actuators can be used to increase the intensity of tactile pressure stimuli. With the ability to create an array of inflatable micro-bladders using the disclosed methods, actuators that have customizable surface texture are created. Based on the pressure the array of micro-bladders is pressurized to, different surface textures (soft to spiky) are realized on the soft actuator to simulate texture of virtual objects or increase the intensity of a tactile pressure stimuli.

Tunable physical bonding. Using the disclosed fabrication methods, the periodic length of the channel arrays can be reduced to the range of hundreds of nanometer and tens of micrometer. Under these circumstances, the surface grooves from the channels provide physical bonding after the channels are inflated by air flow. This, in turn, provides additional dimension of haptic sensation. Furthermore, the reversibility of the fluidic inflation process, provided the present disclosure, achieves on-off adhesion sensation, which is important for cross-reality applications.

Tunable optical display: The on-off switch of the four-dimensional fluidic channels synthesized by the methods of the present disclosure provide tunable optical performance as well. For example, the inflated channels make surface grooves with periodic length matching the wavelength of the light. Thus, those grooves can act as diffraction gratings that can split and diffract light into several beams. Those beams can travel in different directions to provide structural coloration. The structural coloration can be switched (on-off) by blowing or zipping the four-dimensional fluidic channels.

BRIEF DESCRIPTION OF THE DRAWINGS

The foregoing summary, as well as the following detailed description of the present disclosure, will be better understood when read in conjunction with the appended drawings.

FIG. 4A illustrates a first step of curing urethane acrylate by a multifunctional thiol in accordance with the present disclosure and FIG. 4B illustrates a second step of ultraviolet light triggered thiol-ene chemistry to give a fully cured elastomer in accordance with the present disclosure.

DETAILED DESCRIPTION

I. Introduction

The present disclosure describes ways to fabricate nano- and micro-size inflatable four dimensional fluidic channels based on ultraviolet patterning of B-stage elastomeric films. The B-stage elastomeric films can be fabricated based on the thiol Michael-Addition of urethane acrylate with multi-functional in the presence of urethane ally ether as additive. See, for example, U.S. Patent Application No. 63/163,603 entitled "UV Curable and Stretchable B-stage Urethane Acrylate/Thiol Films for Soft Actuator Assembly," filed Mar. 19, 2021, which is hereby incorporated by reference.

The urethane acrylate can react with excess multi-functional thiol at room temperature or elevated temperature in the presence of base without the need of ultra-violet light to form the initial B-stage film. Further thiol-ene chemistry of urethane allyl ether with the thiol functional groups in the prepolymer can be triggered by ultra-violet light in the presence of photo-initiator, thus enabling top-down lithography to generate high-resolution patterns with the periodic length from 100 nm~1 mm.

A further step to stack the films, which have been selectively exposed by ultra-violet light, to align the patterns can be done by wafer aligning processes. The area exposed by ultra-violet light will be tack-free and resist to be bonded between layers, while the area not exposed by ultra-violet light will adhere between layers easily. Further ultra-violet light exposure can cure the areas that have not yet been exposed by ultra-violet light to form covalent bond with cohesive failure. The area initially exposed by ultra-violet light remain unbonded and can be inflated by blowing air or other fluids through it to form three-dimensional fluidic channels. The inflation process is reversable after releasing the pressure of the fluidic flow, and the three-dimensional channel can be zipped back due to the elasticity of the film, thus making the fluidic channel four-dimensional, where the fourth dimension is a time dimension.

Synthetic Methods.

Figure 1:
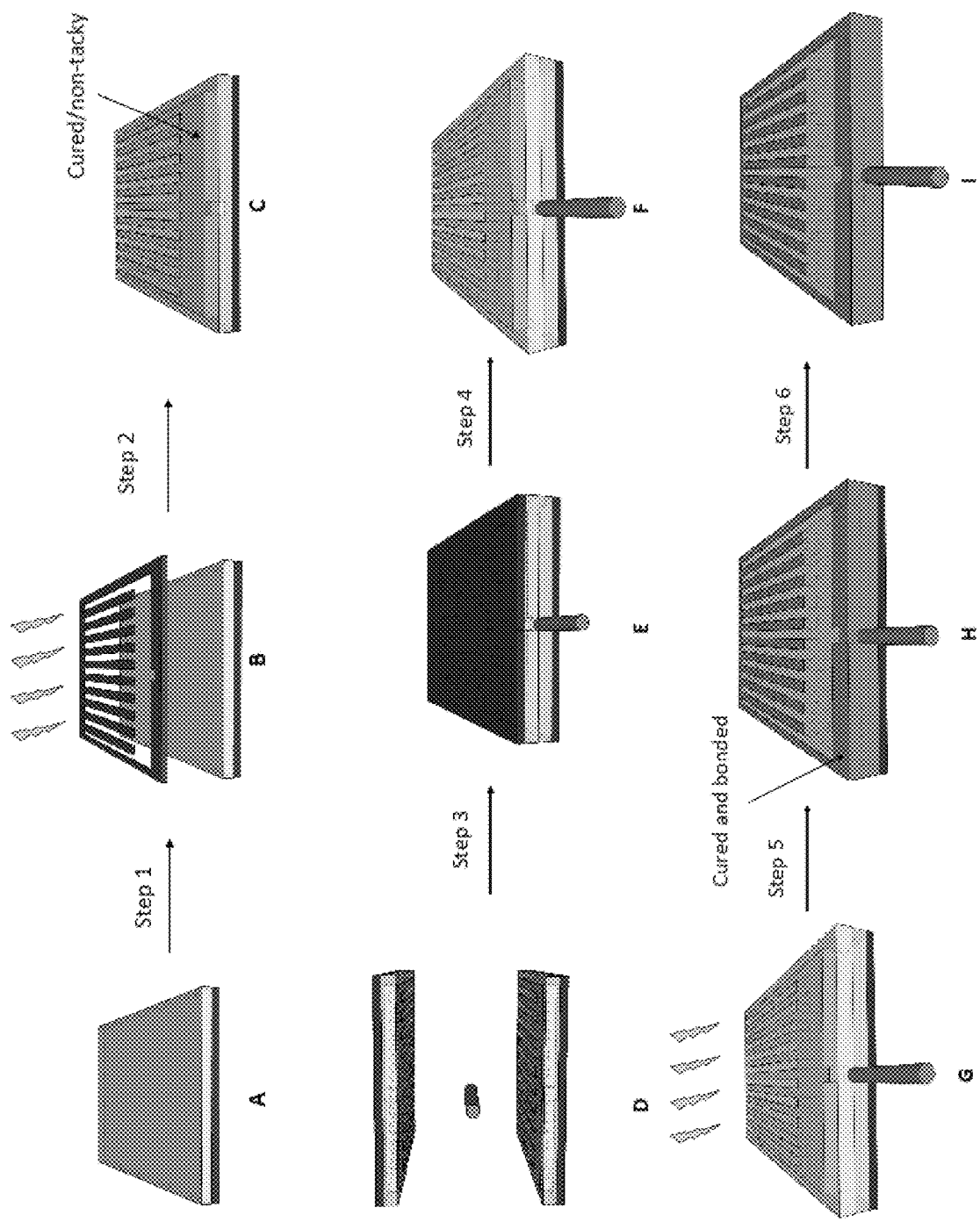
FIG. 1 illustrates a fabrication process for the inflatable three-dimensional channels in accordance with the present disclosure.

The proposed process is demonstrated in the FIG. 1. A B-stage film (A) was formed on a silicon wafer after cured at room temperature or elevated temperature as shown by Step 1 in FIG. 1, which can be selectively ultraviolet light exposed using a photomask (B). Upon ultraviolet light exposure (Step 2), the area exposed by ultraviolet light will be further cured as non-tacky film, while the area unexposed will remain tacky. By co-designing the chemistry of the B-stage elastomeric film and the lithography process, the pattern size can be achieved in the range of 100 nm to 1 mm (C).

A further step is to precisely stack the films (D) and align the patterns while sandwiching a tubing for fluid supply can be done by a wafer aligning process (Step 3). The area exposed by ultraviolet light will be tack-free and resist to be bonded between layers, while the area not exposed by ultraviolet light will adhere between layers easily. After peeling off the wafer from one side (Step 4), the stacked films can be further ultraviolet light radiated to cure the non-exposed area in the first lithography step (Step 2) to form covalent bond, which can give cohesive failure during T-peel test (Step 5).

Figure 2:
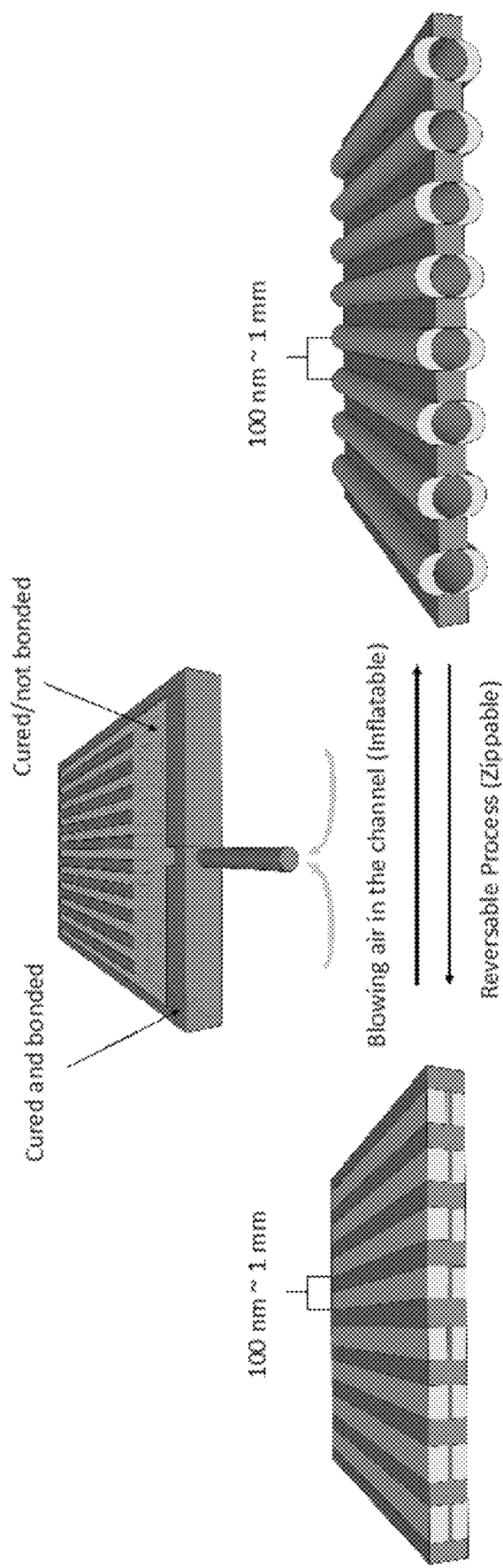
FIG. 2 provides a schematic demonstration of inflatable and zippable four-dimensional channels in accordance with the present disclosure.

After peeling off the wafer from the other side, pump air or other fluids through the tubing in I (FIG. 1). The area initially exposed by ultraviolet light remain unbonded and can be inflated by blowing air or other fluids through it to form three-dimensional fluidic channels. The inflation process is reversable after releasing the pressure of the fluidic flow, and the three-dimensional channels can be zipped back due to the elasticity of the film, thus making the fluidic channel as four-dimensional as illustrated in FIG. 2.

To make high-resolution periodic structures with photolithography processes there are several suitable options that depend on the desired length scale and resolution. A non-contact, maskless aligner can be used to expose features down to 2 μm wide and with sub-micron alignment accuracy. For smaller pitch patterns, laser interference lithography can be implemented to achieve feature spacing on the order of hundreds of nanometers. Laser interference lithography involves the splitting and subsequent refocusing of a laser beam to create an interference pattern. The periodicity of this pattern depends on the wavelength of the laser being used as well as the intersection angle of the converging beams.

In another embodiment, the step 2 and step 3 in FIG. 1 can be exchanged while using transparent substrates instead of silicon wafers. This means the film can be stacked together but some gap is left between the layers (in the range of 500 nm to 1 micron), followed by a lithography step to selectively cure the films with the pattern size in the range of 100 nm to 1 mm. Then, the films can be further compressed together and further cured by excess of ultra-violet radiation. This alternative process can avoid the pattern alignment step.

In another embodiment, the edges of the fluidic channels are photo-irradiated to create a bond between layers. The fluidic channels are then pressurized to inflate and separate the layers (as shown in FIG. 2). The entire article (or portions of the article) is then irradiated again, to react the B-stage polymer without creating interlayer bonds in the fluidic channels. This also alters the mechanical properties of the material above the fluidic channels to create non-linear deformation curves (e.g., strain locking, reducing energy required to re-inflate the channels).

In another embodiment, the fluidic channels are initially partially opened with the height of hundreds of nanometers instead of being fully closed. In this way, the resistance to fluid flow is reduced for easier channel expansion. Various approaches to the fabrication of these initially opened three-dimensional channels in elastomers is illustrated in FIG. 3.

Figure 3:
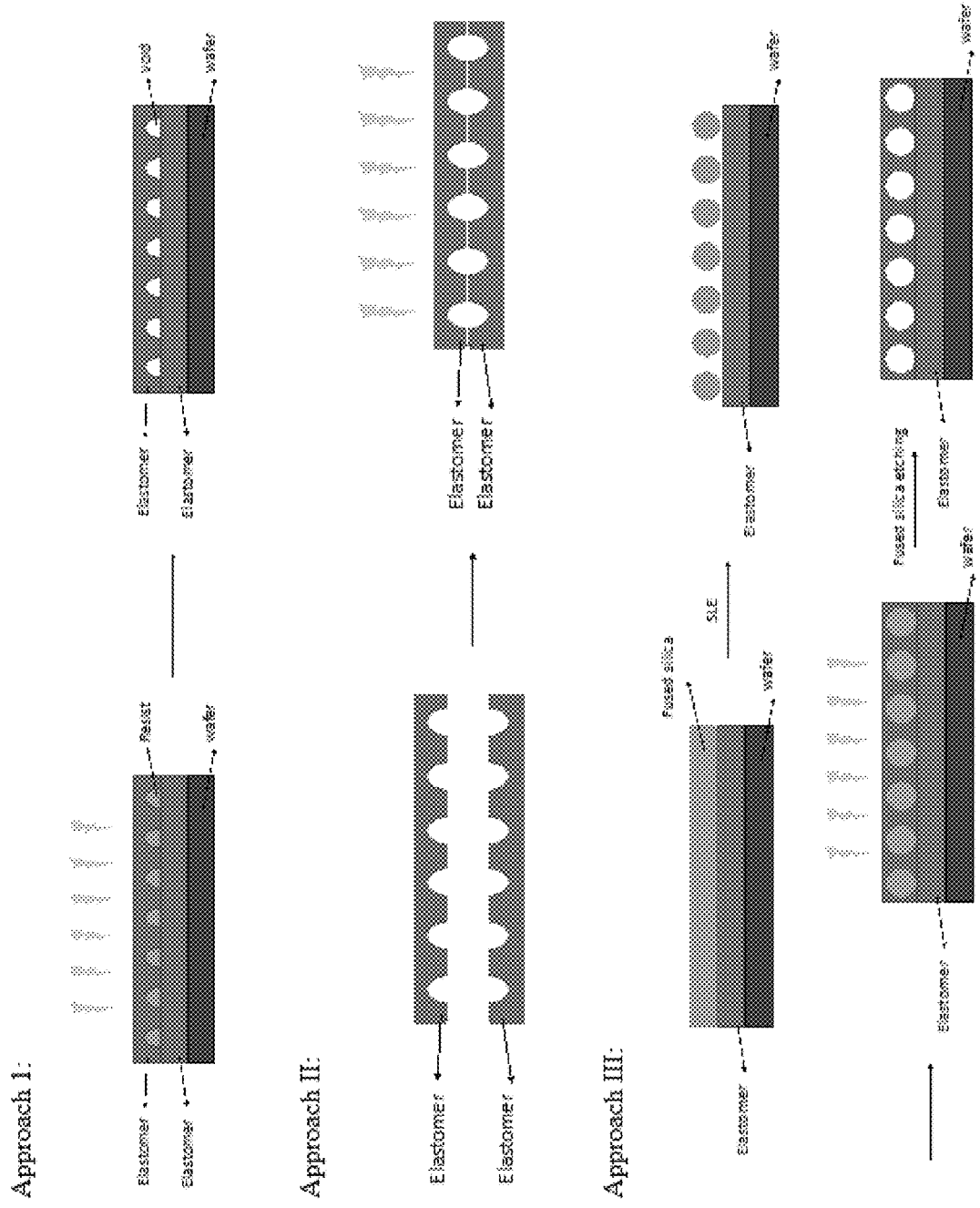
FIG. 3 illustrates the fabrication of initially opened three-dimensional channels in accordance with the present disclosure.

Approach I of FIG. 3 comprises the following: (i) spin coat the B-stage elastomer precursors on wafer and cure it at room temperature or elevated temperature, (ii) coat the resist on top of the B-stage elastomer, (iii) pattern and etch the resist (e.g., photo, nanoimprint, etc.), (iv) spin coat and cure a second layer of the elastomer on top of the patterned resist, (v) ultraviolet light exposure to covalently bond the elastomer layers, and (vi) dissolve the resist to make the three-dimensional channels.

Approach II of FIG. 3 comprises patterning of two B-stage elastomer films separately and covalently bond them using ultraviolet light exposure.

Approach III comprises the following: (i) deposit the fused silica layer on top of the B-stage elastomeric film, (ii) selective laser etching to form silica cylinders, (iii) spin coat another B-stage elastomer layer on top of the fused silica cylinders and cure it at room temperature or elevated temperature, (iv) ultraviolet light exposure to covalently bond the elastomeric layers, and (v) etch the fused silica away to form the three-dimensional channels.

Materials.

Any B-stage elastomeric film can be used to fabricate the four-dimensional fluidic micro-/nano-channels with the second step chemistry triggerable by ultraviolet light. It can include ultraviolet curable B-stage silicone, acrylate, epoxy, urethane, polysulfide, polythioether, etc.

In some embodiments, the B-stage elastomeric film is fabricated based on the chemistry of urethane acrylate/allyl ether cured by multi-functional thiols through two different mechanisms. See, for example, U.S. Patent Application No.

Figure 4A:
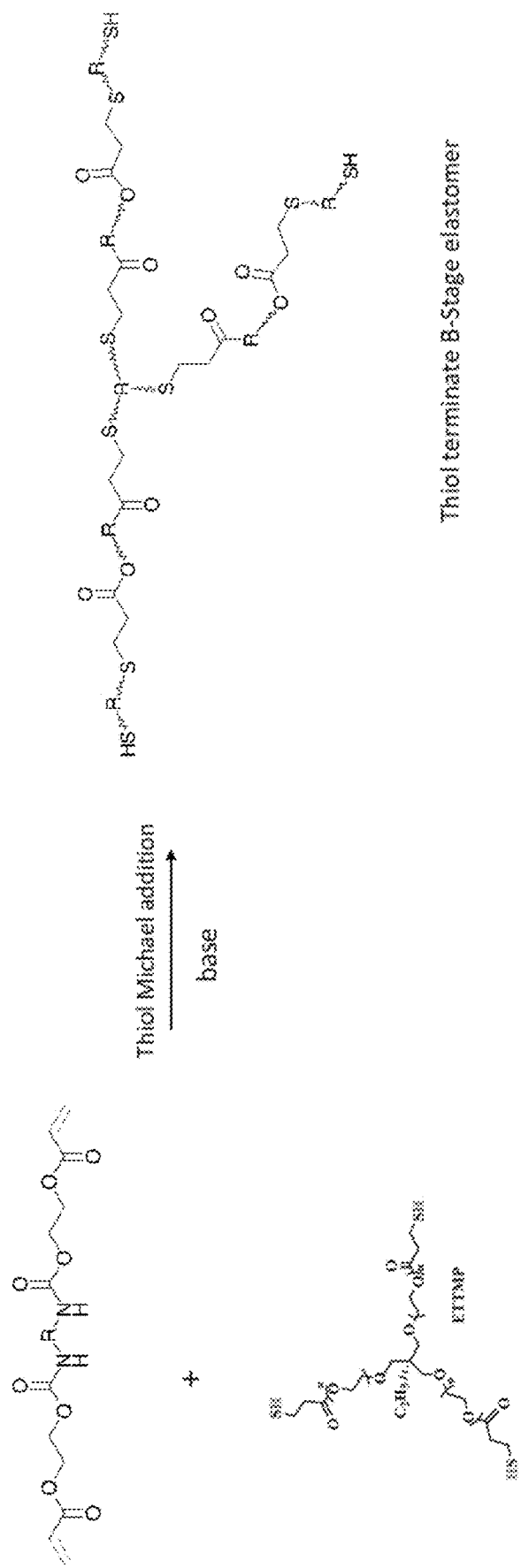
FIGS. 4A and 4B illustrate how extra thiol groups in the urethane acrylate/thiol elastomer are further cured with urethane allyl ether by photoinitiators under ultraviolet light to provide cure-on-demand function, where
Figure 4B:
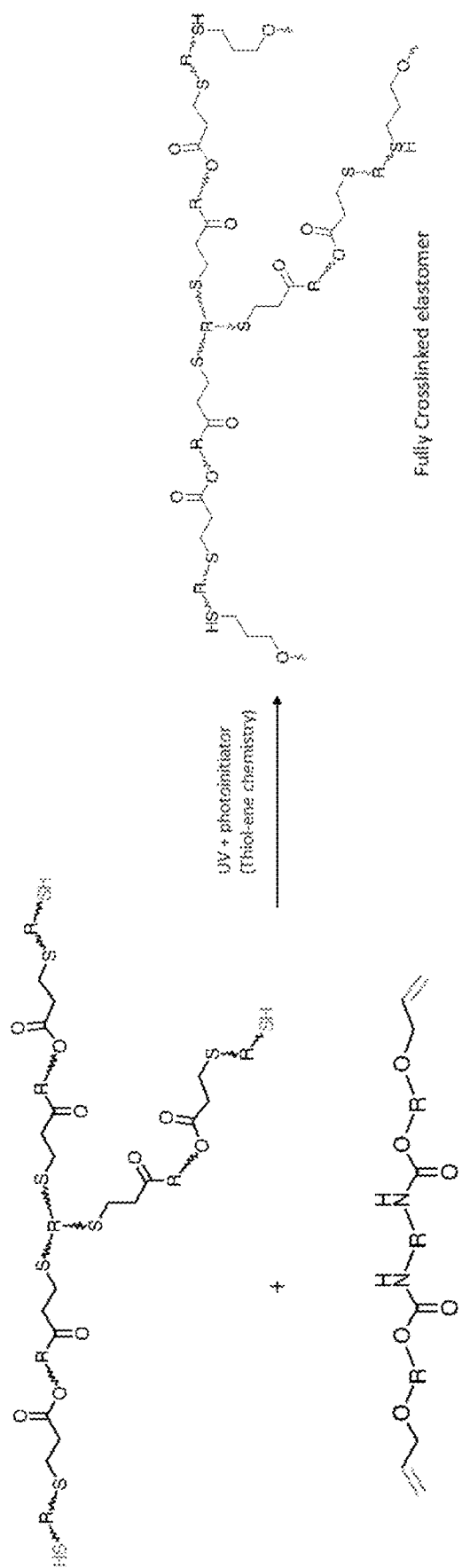

63/163,603 entitled "UV Curable and Stretchable B-stage Urethane Acrylate/Thiol Films for Soft Actuator Assembly," filed Mar. 19, 2021, which is hereby incorporated by reference. The urethane acrylate can react with a multi-functional thiol at room temperature or elevated temperature in the presence of base without the need of ultraviolet light to form the initial B-stage film as illustrated in FIG. 4A. Further chemistry of urethane allyl ether to react with thiols through thiol-ene chemistry can be triggered by a photo-initiator under ultraviolet light as illustrated in FIG. 4B, thus enabling patterning capability to reach high resolution with the range of the periodic length from 100 nm~1 mm, using photolithography, deep UV, or laser interference lithography.

In some embodiments, the formulation comprises urethane acrylate oligomer, multifunctional thiol, base catalyst, urethane allyl ether, and, optionally other additives.

Urethane Acrylate.

In some embodiments, the urethane acrylate oligomer comprises or consists of at least one urethane linkage in the backbone and at least two acrylate functional group in the chain end. In some embodiments, the urethane acrylate oligomer comprises or consist of the product of the following general formula:

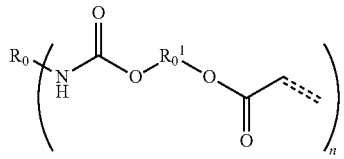

where $R_0$ is any (hetero)hydrocarbyl groups, including aliphatic and aromatic groups; $R_0'$ is any (hetero)hydrocarbyl groups, including aliphatic and aromatic groups; and n is 2, 3, 4, 5, 6, or greater than 6.

In some embodiments, the urethane acrylate oligomer comprises or consist of the product of the following general formula:

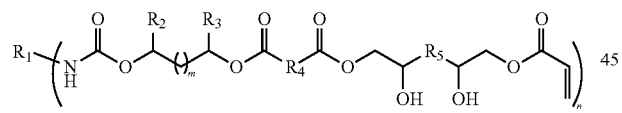

where $R_1$ is a hydrocarbyl group, which is carrying n —NH— groups;

$R_2$ or $R_3$ are substituents that are identical or different and interchangeable in their position, and can be chosen from: H, alkyl or hydroxyalkyl, where alkyl is $C_1$ to $C_3$ alkyl; m is 0, 1, or any number greater than 1;

$R_4$ is alkylene radical, cycloalkylene radical or arylene radical, which can be substituted, in particular by $CH_3$, Et, $CH_3$—$(CH_2)n$ (where n>1), H, OH, OMe, OEt, OiPr, F, Cl, Br, I, Ph, $NO_2$, $SO_3$, $SO_2Me$, iPr, t-Bu, sec-Bu, Et, acetyl, SH, SMe, carboxyl, aldehyde, amide, nitrile, ester, $SO_2NH_3$, $NH_2$, $NMe_2$, NMeH, $C_2H_2$, at any position where on the molecule could be substituted to one of the above functional groups can be considered or a combination thereof, $R_5$ is alkylene radical, cycloalkylene radical or arylene radical, which can be substituted, in particular by $CH_3$, Et, $CH_3$—$(CH_2)n$ (where n is greater than 1), H, OH, OMe, OEt, OiPr, F, Cl, Br, I, Ph, $NO_2$, $SO_3$, $SO_2Me$, iPr, t-Bu, sec-Bu, Et, acetyl, SH, SMe, Carboxyl, aldehyde, amide, nitrile, ester, $SO_2NH_3$, $NH_2$, $NMe_2$, NMeH, $C_2H_2$, at any position where on the molecule could be substituted to one of the above functional groups can be considered or a combination there of, and n is 2 to 6, or greater than 6.

In some embodiments, the urethane acrylate oligomer comprises or consist of the product of the following general formula:

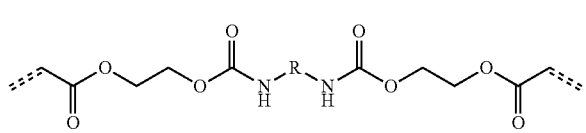

In some embodiments, the R groups are any substituent or chemical moiety described herein.

Multifunctional Thiol.

In some embodiments, the multifunctional thiol has the formula $R_8$—$(SH)_n$, where n is 2 to 6, or greater than 6, $R_8$ includes any (hetero)hydrocarbyl groups, including aliphatic and aromatic monothiols and polythiols; and $R_4$ optionally further includes one or more functional groups including hydroxyl, acid, ester, cyano, urea, urethane and ether groups. In some embodiments, the R groups are any substituent or chemical moiety described herein.

In some embodiments, the multifunctional thiol has the formula:

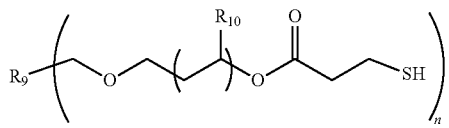

where $R_9$ is hydrocarbyl of valence n in polyol compound, carrying n hydroxyl groups; $R_{10}$ is H or methyl group, and n is 2 to 4.

In some embodiments, the multifunctional thiol has the formula:

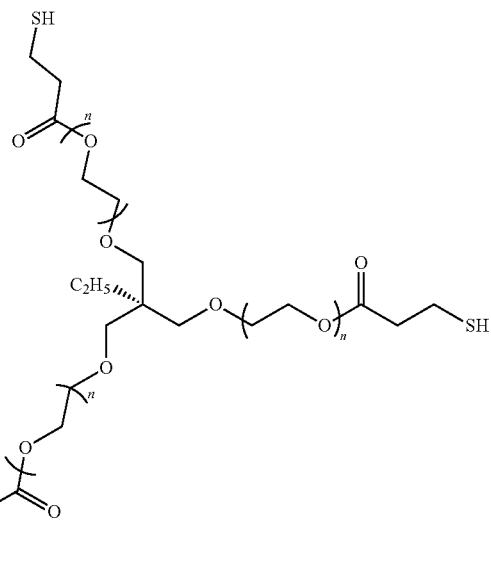

ETTMP

Base Catalyst.

In some embodiments, the base catalyst comprises a tertiary amine. In some embodiments the tertiary amine comprises the 5- or 6-membered aliphatic nitrogen heterocycle (e.g., 1,5-diazabicyclo[4.3.0]non-5-ene (DBN), 1,8-diazabicyclo[5.4.0]undec-7ene (DBU) and 1,4-diazabicyclo[2/2/2]octane (DABCO)) in an amount of 0.005-0.3 wt %, based on the total weight of the composition, or (1-(2-hydroxyethyl)pyrrolidine, 1-(2-hydroxyethyl)pyrrolidone, 1-(2-hydroxyethyl)piperidine, 1-ethylpiperazine, 1-(2-hydroxyethyl)piperazine, 1,4-bis-(2-hydroxyethyl)piperazine, 1-methylimidazole and 4-(2-hydroxyethyl)morpholine) in an amount of 0.3-7 wt % based on the total weight of the composition.

Photoinitiator.

In some embodiments, the photoinitiator(s) used varies depending on the requirements of the system. Ideally, the photoinitiator is highly soluble in the polymer and with an absorption spectrum compatible with the manufacturing process. In some embodiments, a combination of photoinitiators is used. Suitable photoinitiators include Type I initiators such as benzoin ethers, benzil ketals, α-dialkoxy-acetophenones, α-hydroxy-alkyl phenones, α-amino alkyphenones, acyl-phosphine oxides. Type II initiators include benzo-phenones/amines, and thio-xanthones amines. Visible light initiators can also be used, for example titanocenes, etc.

Other Additives

In some embodiments, the formulation includes other additives. Non-limiting examples of such other additives comprise dispersants, plasticizers, polymer thinners, etc. In some embodiments, the dispersant stabilizes the inorganic filler particles in the composition—without dispersant, the particles may aggregate, thus adversely affecting the benefit of the particles in the composition. Suitable dispersants depend on the specific identity and surface chemistry of filler. Suitable dispersants may include at least a binding group and a compatibilizing segment. The binding group may be ionically bonded to the particle surface. Examples of binding groups for alumina particles include phosphoric acid, phosphonic acid, sulfonic acid, carboxylic acid, and the amine. The compatibilizing segment may be selected to be miscible with the curable matrix.

Urethane Allyl Ether.

In some embodiments, the urethane allyl ether oligomer comprises at least one urethane linkage in the backbone and at least two allyl ether functional group in the chain end. In some embodiments, the urethane allyl ether oligomer comprises the product of the following general formula:

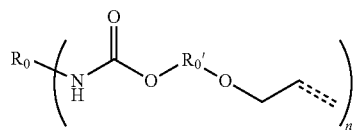

where $R_0$ is any (hetero)hydrocarbyl groups, including aliphatic and aromatic groups; $R_0'$ is any (hetero)hydrocarbyl groups, including aliphatic and aromatic groups; n can be 2, 3, 4, 5, 6, or greater than 6.

In some embodiments, the urethane allyl ether oligomer has the following general formula:

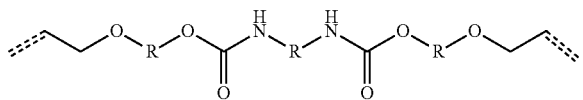

In some embodiments, one of the substrates is a film with surface thiol, vinyl, thiol and vinyl groups. These groups can be deposited via silane coupling agents or innate to the substrate. The substrate does not need to be a B-stage polymer. This other substrate would participate in photo-initiated bonding with the B-stage polymer film.

Definitions

Unless defined otherwise, all technical and scientific terms used herein have the same meaning as is commonly understood by one of skill in the art to which this disclosure belongs. All patents and publications referred to herein are incorporated by reference in their entireties.

When ranges are used herein to describe, for example, physical or chemical properties such as molecular weight or chemical formulae, all combinations and subcombinations of ranges and specific embodiments therein are intended to be included. Use of the term "about" when referring to a number or a numerical range means that the number or numerical range referred to is an approximation within experimental variability (or within statistical experimental error), and thus the number or numerical range may vary. The variation is typically from 0% to 15%, or from 0% to 10%, or from 0% to 5% of the stated number or numerical range. The term "including" (and related terms such as "comprise" or "comprises" or "having" or "including") includes those embodiments such as, for example, an embodiment of any composition of matter, method or process that "consist of" or "consist essentially of" the described features.

Unless otherwise stated, the chemical structures depicted herein are intended to include compounds which differ only in the presence of one or more isotopically enriched atoms. For example, compounds where one or more hydrogen atoms is replaced by deuterium or tritium, or where one or more carbon atoms is replaced by $^{13}C$- or $^{14}C$-enriched carbons, are within the scope of this disclosure.

"Alkyl" refers to a straight or branched hydrocarbon chain radical consisting solely of carbon and hydrogen atoms, containing no unsaturation, having from one to ten carbon atoms (e.g., $(C_{1-10})$alkyl or $C_{1-10}$ alkyl). Whenever it appears herein, a numerical range such as "1 to 10" refers to each integer in the given range—e.g., "1 to 10 carbon atoms" means that the alkyl group may consist of 1 carbon atom, 2 carbon atoms, 3 carbon atoms, etc., up to and including 10 carbon atoms, although the definition is also intended to cover the occurrence of the term "alkyl" where no numerical range is specifically designated. Typical alkyl groups include, but are in no way limited to, methyl, ethyl, propyl, isopropyl, n-butyl, isobutyl, sec-butyl isobutyl, tertiary butyl, pentyl, isopentyl, neopentyl, hexyl, septyl, octyl, nonyl and decyl. The alkyl moiety may be attached to the rest of the molecule by a single bond, such as for example, methyl (Me), ethyl (Et), n-propyl (Pr), 1-methylethyl (isopropyl), n-butyl, n-pentyl, 1,1-dimethylethyl (t-butyl) and 3-methylhexyl. Unless stated otherwise specifically in the specification, an alkyl group is optionally substituted by one or more of substituents which are independently heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(N-R$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$ where each R$^a$ is independently hydrogen, fluoroalkyl, carbocyclyl, carbocyclylalkyl, aryl, aralkyl, heterocycloalkyl, heterocycloalkylalkyl, heteroaryl or heteroarylalkyl.

"Alkylaryl" refers to an -(alkyl)aryl radical where aryl and alkyl are as disclosed herein and which are optionally substituted by one or more of the substituents described as suitable substituents for aryl and alkyl respectively.

"Alkylhetaryl" refers to an -(alkyl)hetaryl radical where hetaryl and alkyl are as disclosed herein and which are optionally substituted by one or more of the substituents described as suitable substituents for aryl and alkyl respectively.

"Alkylheterocycloalkyl" refers to an -(alkyl) heterocyclyl radical where alkyl and heterocycloalkyl are as disclosed herein and which are optionally substituted by one or more of the substituents described as suitable substituents for heterocycloalkyl and alkyl respectively.

An "alkene" moiety refers to a group consisting of at least two carbon atoms and at least one carbon-carbon double bond, and an "alkyne" moiety refers to a group consisting of at least two carbon atoms and at least one carbon-carbon triple bond. The alkyl moiety, whether saturated or unsaturated, may be branched, straight chain, or cyclic.

"Alkenyl" refers to a straight or branched hydrocarbon chain radical group consisting solely of carbon and hydrogen atoms, containing at least one double bond, and having from two to ten carbon atoms (e.g., (C$_{2-10}$)alkenyl or C$_{2-10}$ alkenyl). Whenever it appears herein, a numerical range such as "2 to 10" refers to each integer in the given range—e.g., "2 to 10 carbon atoms" means that the alkenyl group may consist of 2 carbon atoms, 3 carbon atoms, etc., up to and including 10 carbon atoms. The alkenyl moiety may be attached to the rest of the molecule by a single bond, such as for example, ethenyl (e.g., vinyl), prop-1-enyl (e.g., allyl), but-1-enyl, pent-1-enyl and penta-1,4-dienyl. Unless stated otherwise specifically in the specification, an alkenyl group is optionally substituted by one or more substituents which are independently alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Alkenyl-cycloalkyl" refers to an -(alkenyl)cycloalkyl radical where alkenyl and cycloalkyl are as disclosed herein and which are optionally substituted by one or more of the substituents described as suitable substituents for alkenyl and cycloalkyl respectively.

"Alkynyl" refers to a straight or branched hydrocarbon chain radical group consisting solely of carbon and hydrogen atoms, containing at least one triple bond, having from two to ten carbon atoms (e.g., (C$_{2-10}$)alkynyl or C$_{2-10}$ alkynyl). Whenever it appears herein, a numerical range such as "2 to 10" refers to each integer in the given range—e.g., "2 to 10 carbon atoms" means that the alkynyl group may consist of 2 carbon atoms, 3 carbon atoms, etc., up to and including 10 carbon atoms. The alkynyl may be attached to the rest of the molecule by a single bond, for example, ethynyl, propynyl, butynyl, pentynyl and hexynyl. Unless stated otherwise specifically in the specification, an alkynyl group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(N-R$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Alkynyl-cycloalkyl" refers to an -(alkynyl)cycloalkyl radical where alkynyl and cycloalkyl are as disclosed herein and which are optionally substituted by one or more of the substituents described as suitable substituents for alkynyl and cycloalkyl respectively.

"Carboxaldehyde" refers to a —(C=O)H radical.

"Carboxyl" refers to a —(C=O)OH radical.

"Cyano" refers to a —CN radical.

"Cycloalkyl" refers to a monocyclic or polycyclic radical that contains only carbon and hydrogen, and may be saturated, or partially unsaturated. Cycloalkyl groups include groups having from 3 to 10 ring atoms (e.g. (C$_{3-10}$)cycloalkyl or C$_{3-10}$ cycloalkyl). Whenever it appears herein, a numerical range such as "3 to 10" refers to each integer in the given range—e.g., "3 to 10 carbon atoms" means that the cycloalkyl group may consist of 3 carbon atoms, etc., up to and including 10 carbon atoms. Illustrative examples of cycloalkyl groups include, but are not limited to the following moieties: cyclopropyl, cyclobutyl, cyclopentyl, cyclopentenyl, cyclohexyl, cyclohexenyl, cycloheptyl, cyclooctyl, cyclononyl, cyclodecyl, norbornyl, and the like. Unless stated otherwise specifically in the specification, a cycloalkyl group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Cycloalkyl-alkenyl" refers to a -(cycloalkyl)alkenyl radical where cycloalkyl and alkenyl are as disclosed herein and which are optionally substituted by one or more of the substituents described as suitable substituents for cycloalkyl and alkenyl, respectively.

"Cycloalkyl-heterocycloalkyl" refers to a -(cycloalkyl) heterocycloalkyl radical where cycloalkyl and heterocycloalkyl are as disclosed herein and which are optionally substituted by one or more of the substituents described as suitable substituents for cycloalkyl and heterocycloalkyl, respectively.

"Cycloalkyl-heteroaryl" refers to a -(cycloalkyl)heteroaryl radical where cycloalkyl and heteroaryl are as disclosed herein and which are optionally substituted by one or more of the substituents described as suitable substituents for cycloalkyl and heteroaryl, respectively.

The term "alkoxy" refers to the group —O-alkyl, including from 1 to 8 carbon atoms of a straight, branched, cyclic configuration and combinations thereof attached to the parent structure through an oxygen. Examples include, but are not limited to, methoxy, ethoxy, propoxy, isopropoxy, cyclopropyloxy and cyclohexyloxy. "Lower alkoxy" refers to alkoxy groups containing one to six carbons.

The term "substituted alkoxy" refers to alkoxy where the alkyl constituent is substituted (e.g., —O-(substituted alkyl)). Unless stated otherwise specifically in the specification, the alkyl moiety of an alkoxy group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —$OR^a$, —$SR^a$, —OC(O)—$R^a$, —$N(R^a)_2$, —C(O)$R^a$, —C(O)O$R^a$, —OC(O)N($R^a$)$_2$, —C(O)N($R^a$)$_2$, —N($R^a$)C(O)O$R^a$, —N($R^a$)C(O)$R^a$, —N($R^a$)C(O)N($R^a$)$_2$, N($R^a$)C(N$R^a$)N($R^a$)$_2$, —N($R^a$)S(O)$_t$$R^a$ (where t is 1 or 2), —S(O)$_t$O$R^a$ (where t is 1 or 2), —S(O)$_t$N($R^a$)$_2$ (where t is 1 or 2), —S(O)$_t$N($R^a$)C(O)$R^b$ (where t is 1 or 2), or PO$_3$($R^a$)$_2$, where each $R^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

The term "alkoxycarbonyl" refers to a group of the formula (alkoxy)(C=O)— attached through the carbonyl carbon where the alkoxy group has the indicated number of carbon atoms. Thus a (C$_{1-6}$)alkoxycarbonyl group is an alkoxy group having from 1 to 6 carbon atoms attached through its oxygen to a carbonyl linker. "Lower alkoxycarbonyl" refers to an alkoxycarbonyl group where the alkoxy group is a lower alkoxy group.

The term "substituted alkoxycarbonyl" refers to the group (substituted alkyl)-O—C(O)— where the group is attached to the parent structure through the carbonyl functionality. Unless stated otherwise specifically in the specification, the alkyl moiety of an alkoxycarbonyl group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —$OR^a$, —$SR^a$, —OC(O)—$R^a$, —$N(R^a)_2$, —C(O)$R^a$, —C(O)O$R^a$, —OC(O)N($R^a$)$_2$, —C(O)N($R^a$)$_2$, —N($R^a$)C(O)O$R^a$, —N($R^a$)C(O)$R^a$, —N($R^a$)C(O)N($R^a$)$_2$, N($R^a$)C(N$R^a$)N($R^a$)$_2$, —N($R^a$)S(O)$_t$$R^a$ (where t is 1 or 2), —S(O)$_t$O$R^a$ (where t is 1 or 2), —S(O)$_t$N($R^a$)$_2$ (where t is 1 or 2), —S(O)$_t$N($R^a$)C(O)$R^a$ (where t is 1 or 2), or PO$_3$($R^a$)$_2$, where each $R^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Acyl" refers to the groups (alkyl)-C(O)—, (aryl)-C(O)—, (heteroaryl)-C(O)—, (heteroalkyl)-C(O)— and (heterocycloalkyl)-C(O)—, where the group is attached to the parent structure through the carbonyl functionality. If the R radical is heteroaryl or heterocycloalkyl, the hetero ring or chain atoms contribute to the total number of chain or ring atoms. Unless stated otherwise specifically in the specification, the alkyl, aryl or heteroaryl moiety of the acyl group is optionally substituted by one or more substituents which are independently alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —$OR^a$, —$SR^a$, —OC(O)—$R^a$, —$N(R^a)_2$, —C(O)$R^a$, —C(O)O$R^a$, —OC(O)N($R^a$)$_2$, —C(O)N($R^a$)$_2$, —N($R^a$)C(O)O$R^a$, —N($R^a$)C(O)$R^a$, —N($R^a$)C(O)N($R^a$)$_2$, N($R^a$)C(N$R^a$)N($R^a$)$_2$, —N($R^a$)S(O)$_t$$R^a$ (where t is 1 or 2), —S(O)$_t$O$R^a$ (where t is 1 or 2), —S(O)$_t$N($R^a$)$_2$ (where t is 1 or 2), —S(O)$_t$N($R^a$)C(O)$R^b$ (where t is 1 or 2), or PO$_3$($R^a$)$_2$, where each $R^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Acyloxy" refers to a R(C=O)O— radical where R is alkyl, aryl, heteroaryl, heteroalkyl or heterocycloalkyl, which are as described herein. If the R radical is heteroaryl or heterocycloalkyl, the hetero ring or chain atoms contribute to the total number of chain or ring atoms. Unless stated otherwise specifically in the specification, the R of an acyloxy group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —$OR^a$, —$SR^a$, —OC(O)—$R^a$, —$N(R^a)_2$, —C(O)$R^a$, —C(O)O$R^a$, —OC(O)N($R^a$)$_2$, —C(O)N($R^a$)$_2$, —N($R^a$)C(O)O$R^a$, —N($R^a$)C(O)$R^a$, —N($R^a$)C(O)N($R^a$)$_2$, N($R^a$)C(N$R^a$)N($R^a$)$_2$, —N($R^a$)S(O)$_t$$R^a$ (where t is 1 or 2), —S(O)$_t$O$R^a$ (where t is 1 or 2), —S(O)$_t$N($R^a$)$_2$ (where t is 1 or 2), —S(O)$_t$N($R^a$)C(O)$R^a$ (where t is 1 or 2), or PO$_3$($R^a$)$_2$, where each $R^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Amino" or "amine" refers to a —$N(R^a)_2$ radical group, where each $R^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl, unless stated otherwise specifically in the specification. When a —$N(R^a)_2$ group has two $R^a$ substituents other than hydrogen, they can be combined with the nitrogen atom to form a 4-, 5-, 6- or 7-membered ring. For example, —$N(R^a)_2$ is intended to include, but is not limited to, 1-pyrrolidinyl and 4-morpholinyl. Unless stated otherwise specifically in the specification, an amino group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —$OR^a$, —$SR^a$, —OC(O)—$R^a$, —$N(R^a)_2$, —C(O)$R^a$, —C(O)O$R^a$, —OC(O)N($R^a$)$_2$, —C(O)N($R^a$)$_2$, —N($R^a$)C(O)O$R^a$, —N($R^a$)C(O)$R^a$, —N($R^a$)C(O)N($R^a$)$_2$, N($R^a$)C(N$R^a$)N($R^a$)$_2$, —N($R^a$)S(O)$_t$$R^a$ (where t is 1 or 2), —S(O)$_t$O$R^a$ (where t is 1 or 2), —S(O)$_t$N($R^a$)$_2$ (where t is 1 or 2), —S(O)$_t$N($R^a$)C(O)$R^a$ (where t is 1 or 2), —S(O)$_t$N($R^a$)C(O)$R^a$ (where t is 1 or 2), or PO$_3$($R^a$)$_2$, where each $R^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

The term "substituted amino" also refers to N-oxides of the groups —NHR$^d$, and NR$^d$R$^d$ each as described above. N-oxides can be prepared by treatment of the corresponding amino group with, for example, hydrogen peroxide or m-chloroperoxybenzoic acid.

"Amide" or "amido" refers to a chemical moiety with formula —C(O)N(R)$_2$ or —NHC(O)R, where R is selected from the group consisting of hydrogen, alkyl, cycloalkyl, aryl, heteroaryl (bonded through a ring carbon) and heteroalicyclic (bonded through a ring carbon), each of which moiety may itself be optionally substituted. The $R^2$ of —N(R)$_2$ of the amide may optionally be taken together with the nitrogen to which it is attached to form a 4-, 5-, 6- or 7-membered ring. Unless stated otherwise specifically in the specification, an amido group is optionally substituted independently by one or more of the substituents as described herein for alkyl, cycloalkyl, aryl, heteroaryl, or heterocycloalkyl. An amide may be an amino acid or a peptide molecule attached to a compound disclosed herein, thereby forming a prodrug. The procedures and specific groups to make such amides are known to those of skill in the art and can readily be found in seminal sources such as Greene and Wuts, Protective Groups in Organic Synthesis, 3$^{rd}$ Ed., John Wiley & Sons, New York, N.Y., 1999, which is incorporated herein by reference in its entirety.

"Aromatic" or "aryl" or "Ar" refers to an aromatic radical with six to ten ring atoms (e.g., $C_6$-$C_{10}$ aromatic or $C_6$-$C_{10}$ aryl) which has at least one ring having a conjugated pi electron system which is carbocyclic (e.g., phenyl, fluorenyl, and naphthyl). Bivalent radicals formed from substituted benzene derivatives and having the free valences at ring atoms are named as substituted phenylene radicals. Bivalent radicals derived from univalent polycyclic hydrocarbon radicals whose names end in "-yl" by removal of one hydrogen atom from the carbon atom with the free valence are named by adding "-idene" to the name of the corresponding univalent radical, e.g., a naphthyl group with two points of attachment is termed naphthylidene. Whenever it appears herein, a numerical range such as "6 to 10" refers to each integer in the given range; e.g., "6 to 10 ring atoms" means that the aryl group may consist of 6 ring atoms, 7 ring atoms, etc., up to and including 10 ring atoms. The term includes monocyclic or fused-ring polycyclic (e.g., rings which share adjacent pairs of ring atoms) groups. Unless stated otherwise specifically in the specification, an aryl moiety is optionally substituted by one or more substituents which are independently alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl. It is understood that a substituent R attached to an aromatic ring at an unspecified position,

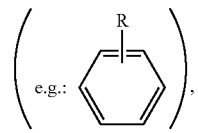

includes one or more, and up to the maximum number of possible substituents.

The term "aryloxy" refers to the group —O-aryl.

The term "substituted aryloxy" refers to aryloxy where the aryl substituent is substituted (e.g., —O-(substituted aryl)). Unless stated otherwise specifically in the specification, the aryl moiety of an aryloxy group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Aralkyl" or "arylalkyl" refers to an (aryl)alkyl-radical where aryl and alkyl are as disclosed herein and which are optionally substituted by one or more of the substituents described as suitable substituents for aryl and alkyl respectively.

"Ester" refers to a chemical radical of formula —COOR, where R is selected from the group consisting of alkyl, cycloalkyl, aryl, heteroaryl (bonded through a ring carbon) and heteroalicyclic (bonded through a ring carbon). The procedures and specific groups to make esters are known to those of skill in the art and can readily be found in seminal sources such as Greene and Wuts, Protective Groups in Organic Synthesis, 3$^{rd}$ Ed., John Wiley & Sons, New York, N.Y., 1999, which is incorporated herein by reference in its entirety. Unless stated otherwise specifically in the specification, an ester group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Fluoroalkyl" refers to an alkyl radical, as defined above, that is substituted by one or more fluoro radicals, as defined above, for example, trifluoromethyl, difluoromethyl, 2,2,2-trifluoroethyl, 1-fluoromethyl-2-fluoroethyl, and the like. The alkyl part of the fluoroalkyl radical may be optionally substituted as defined above for an alkyl group.

"Halo," "halide," or, alternatively, "halogen" is intended to mean fluoro, chloro, bromo or iodo. The terms "haloalkyl," "haloalkenyl," "haloalkynyl," and "haloalkoxy" include alkyl, alkenyl, alkynyl and alkoxy structures that are substituted with one or more halo groups or with combinations thereof. For example, the terms "fluoroalkyl" and "fluoroalkoxy" include haloalkyl and haloalkoxy groups, respectively, in which the halo is fluorine.

"Heteroalkyl," "heteroalkenyl," and "heteroalkynyl" refer to optionally substituted alkyl, alkenyl and alkynyl radicals and which have one or more skeletal chain atoms selected from an atom other than carbon, e.g., oxygen, nitrogen, sulfur, phosphorus or combinations thereof. A numerical range may be given—e.g., $C_1$-$C_4$ heteroalkyl which refers to the chain length in total, which in this example is 4 atoms long. A heteroalkyl group may be substituted with one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Heteroalkylaryl" refers to an -(heteroalkyl)aryl radical where heteroalkyl and aryl are as disclosed herein and which are optionally substituted by one or more of the substituents described as suitable substituents for heteroalkyl and aryl, respectively.

"Heteroalkylheteroaryl" refers to an -(heteroalkyl)heteroaryl radical where heteroalkyl and heteroaryl are as disclosed herein and which are optionally substituted by one or more of the substituents described as suitable substituents for heteroalkyl and heteroaryl, respectively.

"Heteroalkylheterocycloalkyl" refers to an -(heteroalkyl)heterocycloalkyl radical where heteroalkyl and heterocycloalkyl are as disclosed herein and which are optionally substituted by one or more of the substituents described as suitable substituents for heteroalkyl and heterocycloalkyl, respectively.

"Heteroalkylcycloalkyl" refers to an -(heteroalkyl)cycloalkyl radical where heteroalkyl and cycloalkyl are as disclosed herein and which are optionally substituted by one or more of the substituents described as suitable substituents for heteroalkyl and cycloalkyl, respectively.

"Heteroaryl" or "heteroaromatic" or "HetAr" refers to a 5- to 18-membered aromatic radical (e.g., C$_5$-C$_{13}$ heteroaryl) that includes one or more ring heteroatoms selected from nitrogen, oxygen and sulfur, and which may be a monocyclic, bicyclic, tricyclic or tetracyclic ring system. Whenever it appears herein, a numerical range such as "5 to 18" refers to each integer in the given range—e.g., "5 to 18 ring atoms" means that the heteroaryl group may consist of 5 ring atoms, 6 ring atoms, etc., up to and including 18 ring atoms. Bivalent radicals derived from univalent heteroaryl radicals whose names end in "-yl" by removal of one hydrogen atom from the atom with the free valence are named by adding "-idene" to the name of the corresponding univalent radical—e.g., a pyridyl group with two points of attachment is a pyridylidene. A N-containing "heteroaromatic" or "heteroaryl" moiety refers to an aromatic group in which at least one of the skeletal atoms of the ring is a nitrogen atom. The polycyclic heteroaryl group may be fused or non-fused. The heteroatom(s) in the heteroaryl radical are optionally oxidized. One or more nitrogen atoms, if present, are optionally quaternized. The heteroaryl may be attached to the rest of the molecule through any atom of the ring(s). Examples of heteroaryls include, but are not limited to, azepinyl, acridinyl, benzimidazolyl, benzindolyl, 1,3-benzodioxolyl, benzofuranyl, benzooxazolyl, benzo[d]thiazolyl, benzothiadiazolyl, benzo[b][1,4]dioxepinyl, benzo[b][1,4]oxazinyl, 1,4-benzodioxanyl, benzonaphthofuranyl, benzoxazolyl, benzodioxolyl, benzodioxinyl, benzoxazolyl, benzopyranyl, benzopyranonyl, benzofuranyl, benzofuranonyl, benzofurazanyl, benzothiazolyl, benzothienyl(benzothiophenyl), benzothieno[3,2-d]pyrimidinyl, benzotriazolyl, benzo[4,6]imidazo[1,2-a]pyridinyl, carbazolyl, cinnolinyl, cyclopenta[d]pyrimidinyl, 6,7-dihydro-5H-cyclopenta[4,5]thieno[2,3-d]pyrimidinyl, 5,6-dihydrobenzo[h]quinazolinyl, 5,6-dihydrobenzo[h]cinnolinyl, 6,7-dihydro-5H-benzo[6,7]cyclohepta[1,2-c]pyridazinyl, dibenzofuranyl, dibenzothiophenyl, furanyl, furazanyl, furanonyl, furo[3,2-c]pyridinyl, 5,6,7,8,9,10-hexahydrocycloocta[d]pyrimidinyl, 5,6,7,8,9,10-hexahydrocycloocta[d]pyridazinyl, 5,6,7,8,9,10-hexahydrocycloocta[d]pyridinyl, isothiazolyl, imidazolyl, indazolyl, indolyl, indazolyl, isoindolyl, indolinyl, isoindolinyl, isoquinolyl, indolizinyl, isoxazolyl, 5,8-methano-5,6,7,8-tetrahydroquinazolinyl, naphthyridinyl, 1,6-naphthyridinonyl, oxadiazolyl, 2-oxoazepinyl, oxazolyl, oxiranyl, 5,6,6a,7,8,9,10,10a-octahydrobenzo[h]quinazolinyl, 1-phenyl-1H-pyrrolyl, phenazinyl, phenothiazinyl, phenoxazinyl, phthalazinyl, pteridinyl, purinyl, pyranyl, pyrrolyl, pyrazolyl, pyrazolo[3,4-d]pyrimidinyl, pyridinyl, pyrido[3,2-d]pyrimidinyl, pyrido[3,4-d]pyrimidinyl, pyrazinyl, pyrimidinyl, pyridazinyl, pyrrolyl, quinazolinyl, quinoxalinyl, quinolinyl, isoquinolinyl, tetrahydroquinolinyl, 5,6,7,8-tetrahydroquinazolinyl, 5,6,7,8-tetrahydrobenzo[4,5]thieno[2,3-d]pyrimidinyl, 6,7,8,9-tetrahydro-5H-cyclohepta[4,5]thieno[2,3-d]pyrimidinyl, 5,6,7,8-tetrahydropyrido[4,5-c]pyridazinyl, thiazolyl, thiadiazolyl, thiapyranyl, triazolyl, tetrazolyl, triazinyl, thieno[2,3-d]pyrimidinyl, thieno[3,2-d]pyrimidinyl, thieno[2,3-c]pyridinyl, and thiophenyl (e.g., thienyl). Unless stated otherwise specifically in the specification, a heteroaryl moiety is optionally substituted by one or more substituents which are independently: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

Substituted heteroaryl also includes ring systems substituted with one or more oxide (—O—) substituents, such as, for example, pyridinyl N-oxides.

"Heteroarylalkyl" refers to a moiety having an aryl moiety, as described herein, connected to an alkylene moiety, as described herein, where the connection to the remainder of the molecule is through the alkylene group.

"Heterocycloalkyl" refers to a stable 3- to 18-membered non-aromatic ring radical that comprises two to twelve carbon atoms and from one to six heteroatoms selected from nitrogen, oxygen and sulfur. Whenever it appears herein, a numerical range such as "3 to 18" refers to each integer in the given range—e.g., "3 to 18 ring atoms" means that the heterocycloalkyl group may consist of 3 ring atoms, 4 ring atoms, etc., up to and including 18 ring atoms. Unless stated otherwise specifically in the specification, the heterocycloalkyl radical is a monocyclic, bicyclic, tricyclic or tetracyclic ring system, which may include fused or bridged ring systems. The heteroatoms in the heterocycloalkyl radical may be optionally oxidized. One or more nitrogen atoms, if present, are optionally quaternized. The heterocycloalkyl radical is partially or fully saturated. The heterocycloalkyl may be attached to the rest of the molecule through any atom of the ring(s). Examples of such heterocycloalkyl radicals include, but are not limited to, dioxolanyl, thienyl[1,3]dithianyl, decahydroisoquinolyl, imidazolinyl, imidazolidinyl, isothiazolidinyl, isoxazolidinyl, morpholinyl, octahydroindolyl, octahydroisoindolyl, 2-oxopiperazinyl, 2-oxopiperidinyl, 2-oxopyrrolidinyl, oxazolidinyl, piperidinyl, piperazinyl, 4-piperidonyl, pyrrolidinyl, pyrazolidinyl, quinuclidinyl, thiazolidinyl, tetrahydrofuryl, trithianyl, tetrahydropyranyl, thiomorpholinyl, thiamorpholinyl, 1-oxo-thiomorpholinyl, and 1,1-dioxo-thiomorpholinyl. Unless stated otherwise specifically in the specification, a heterocycloalkyl moiety is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —N(R$^a$)$_2$, —C(O)R$^a$, —C(O)OR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$OR$^a$ (where t is 1 or 2), —S(O)$_t$N(R$^a$)$_2$ (where t is 1 or 2), —S(O)$_t$N(R$^a$)C(O)R$^a$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Heterocycloalkyl" also includes bicyclic ring systems where one non-aromatic ring, usually with 3 to 7 ring atoms, contains at least 2 carbon atoms in addition to 1-3 heteroatoms independently selected from oxygen, sulfur, and nitrogen, as well as combinations including at least one of the foregoing heteroatoms; and the other ring, usually with 3 to 7 ring atoms, optionally contains 1-3 heteroatoms independently selected from oxygen, sulfur, and nitrogen and is not aromatic.

"Nitro" refers to the —NO$_2$ radical.

"Oxa" refers to the —O— radical.

"Oxo" refers to the =O radical.

"Isomers" are different compounds that have the same molecular formula. "Stereoisomers" are isomers that differ only in the way the atoms are arranged in space—e.g., having a different stereochemical configuration. "Enantiomers" are a pair of stereoisomers that are non-superimposable mirror images of each other. A 1:1 mixture of a pair of enantiomers is a "racemic" mixture. The term "(±)" is used to designate a racemic mixture where appropriate. "Diastereoisomers" are stereoisomers that have at least two asymmetric atoms, but which are not mirror-images of each other. The absolute stereochemistry is specified according to the Cahn-Ingold-Prelog R-S system. When a compound is a pure enantiomer the stereochemistry at each chiral carbon can be specified by either (R) or (S). Resolved compounds whose absolute configuration is unknown can be designated (+) or (−) depending on the direction (dextro- or levorotatory) which they rotate plane polarized light at the wavelength of the sodium D line. Certain of the compounds described herein contain one or more asymmetric centers and can thus give rise to enantiomers, diastereomers, and other stereoisomeric forms that can be defined, in terms of absolute stereochemistry, as (R) or (S). The present chemical entities, compositions and methods are meant to include all such possible isomers, including racemic mixtures, optically pure forms and intermediate mixtures. Optically active (R)- and (S)-isomers can be prepared using chiral synthons or chiral reagents, or resolved using conventional techniques. When the compounds described herein contain olefinic double bonds or other centers of geometric asymmetry, and unless specified otherwise, it is intended that the compounds include both E and Z geometric isomers.

In some embodiments, enantiomerically enriched compositions have different properties than the racemic mixture of that composition. Enantiomers can be isolated from mixtures by methods known to those skilled in the art, including chiral high pressure liquid chromatography (HPLC) and the formation and crystallization of chiral salts; or preferred enantiomers can be prepared by asymmetric syntheses. See, for example, Jacques, et al., Enantiomers, Racemates and Resolutions, Wiley Interscience, New York (1981); E. L. Eliel, Stereochemistry of Carbon Compounds, McGraw-Hill, New York (1962); and E. L. Eliel and S. H. Wilen, Stereochemistry of Organic Compounds, Wiley-Interscience, New York (1994).

The terms "enantiomerically enriched" and "non-racemic," as used herein, refer to compositions in which the percent by weight of one enantiomer is greater than the amount of that one enantiomer in a control mixture of the racemic composition (e.g., greater than 1:1 by weight). For example, an enantiomerically enriched preparation of the (S)-enantiomer, means a preparation of the compound having greater than 50% by weight of the (S)-enantiomer relative to the (R)-enantiomer, such as at least 75% by weight, or such as at least 80% by weight. In some embodiments, the enrichment can be significantly greater than 80% by weight, providing a "substantially enantiomerically enriched" or a "substantially non-racemic" preparation, which refers to preparations of compositions which have at least 85% by weight of one enantiomer relative to other enantiomer, such as at least 90% by weight, or such as at least 95% by weight. The terms "enantiomerically pure" or "substantially enantiomerically pure" refers to a composition that comprises at least 98% of a single enantiomer and less than 2% of the opposite enantiomer.

"Substituted" means that the referenced group may have attached one or more additional groups, radicals or moieties individually and independently selected from, for example, acyl, alkyl, alkylaryl, cycloalkyl, aralkyl, aryl, carbohydrate, carbonate, heteroaryl, heterocycloalkyl, hydroxy, alkoxy, aryloxy, mercapto, alkylthio, arylthio, cyano, halo, carbonyl, ester, thiocarbonyl, isocyanato, thiocyanato, isothiocyanato, nitro, oxo, perhaloalkyl, perfluoroalkyl, phosphate, silyl, sulfinyl, sulfonyl, sulfonamidyl, sulfoxyl, sulfonate, urea, and amino, including mono- and di-substituted amino groups, and protected derivatives thereof. The substituents themselves may be substituted, for example, a cycloalkyl substituent may itself have a halide substituent at one or more of its ring carbons. The term "optionally substituted" means optional substitution with the specified groups, radicals or moieties.

"Sulfanyl" refers to groups that include —S-(optionally substituted alkyl), —S-(optionally substituted aryl), —S-(optionally substituted heteroaryl) and —S-(optionally substituted heterocycloalkyl).

"Sulfinyl" refers to groups that include —S(O)—H, —S(O)-(optionally substituted alkyl), —S(O)-(optionally substituted amino), —S(O)-(optionally substituted aryl), —S(O)-(optionally substituted heteroaryl) and —S(O)-(optionally substituted heterocycloalkyl).

"Sulfonyl" refers to groups that include —S(O$_2$)—H, —S(O$_2$)-(optionally substituted alkyl), —S(O$_2$)-(optionally substituted amino), —S(O$_2$)-(optionally substituted aryl), —S(O$_2$)-(optionally substituted heteroaryl), and —S(O$_2$)-(optionally substituted heterocycloalkyl).

"Sulfonamidyl" or "sulfonamido" refers to a —S(=O)$_2$—NRR radical, where each R is selected independently from the group consisting of hydrogen, alkyl, cycloalkyl, aryl, heteroaryl (bonded through a ring carbon) and heteroalicyclic (bonded through a ring carbon). The R groups in —NRR of the —S(=O)$_2$—NRR radical may be taken together with the nitrogen to which it is attached to form a 4-, 5-, 6- or 7-membered ring. A sulfonamido group is optionally substituted by one or more of the substituents described for alkyl, cycloalkyl, aryl, heteroaryl, respectively.

"Sulfoxyl" refers to a —S(=O)$_2$OH radical.

"Sulfonate" refers to a —S(=O)$_2$—OR radical, where R is selected from the group consisting of alkyl, cycloalkyl, aryl, heteroaryl (bonded through a ring carbon) and heteroalicyclic (bonded through a ring carbon). A sulfonate group is optionally substituted on R by one or more of the substituents described for alkyl, cycloalkyl, aryl, heteroaryl, respectively.

Compounds of the present disclosure also include crystalline and amorphous forms of those compounds, including, for example, polymorphs, pseudopolymorphs, solvates, hydrates, unsolvated polymorphs (including anhydrates), conformational polymorphs, and amorphous forms of the compounds, as well as mixtures thereof. "Crystalline form" and "polymorph" are intended to include all crystalline and amorphous forms of the compound, including, for example, polymorphs, pseudopolymorphs, solvates, hydrates, unsolvated polymorphs (including anhydrates), conformational polymorphs, and amorphous forms, as well as mixtures thereof, unless a particular crystalline or amorphous form is referred to.

The following clauses describe certain embodiments.

Clause 1. A method of making a B-stage thiol-cured urethane acrylate elastomeric nanostructure comprising a first thiol terminated B-stage elastomer film and a second thiol terminated B-stage elastomer film, the method comprising: curing a combination of a first resin mixture comprising one or more monomers or oligomers on a first substrate to form the first film; overlaying a first patterned mask on the first film, wherein the first patterned mask defines a first repeating pattern; exposing the first film to a first actinic radiation in the presence of an additional monomer or oligomer thereby transferring the first repeating pattern to the first film as a first plurality of repeating respective first and second regions, wherein each respective first region corresponds to a portion of the first film shielded from the actinic radiation during actinic radiation exposure by the first patterned mask and each respective second region corresponds to a portion of the first film exposed to the actinic radiation; curing a combination of a second resin mixture comprising one or more monomers or oligomers on a second substrate to form the second film; overlaying a second patterned mask on the second film, wherein the second patterned mask defines a second repeating pattern; exposing the second film to a second actinic radiation in the presence of an additional monomer or oligomer thereby transferring the second repeating pattern to the second film as a second plurality of repeating respective third and fourth regions within the second film, wherein each respective third region corresponds to a portion of the second film masked from the actinic radiation by the second mask and each respective fourth region corresponds to a portion of the second film exposed to the actinic radiation; sandwiching a first exposed face of the first film to a first exposed face of the second film with each respective second region aligned with a corresponding fourth region thereby forming a plurality of channels that run across the nanostructure with a pitch between respective channels in the plurality of channels that is between 100 nm and 1 mm; removing the second substrate thereby exposing a second face of the first film; and exposing the second face of the first film to a third actinic radiation thereby bonding the first film to the second film through the respective first regions bonding to the respective third regions by the third actinic radiation, wherein the one or more monomers or oligomers in the first and second resin mixture comprise a plurality of first polymerizable or crosslinkable functional groups, and a plurality of second polymerizable or crosslinkable functional groups, wherein the stoichiometric ratio between the first polymerizable or crosslinkable functional groups and the second polymerizable or crosslinkable functional groups is between about 1.15:1 and about 1:1.15.

Clause 2. The method of clause 1, further comprising removing the second substrate.

Clause 3. The method of clause 1 or 2, wherein the first substrate and the second substrate are each made of silicon.

Clause 4. The method of clause 1, wherein the first substrate or the second substrate is optically transparent.

Clause 5. The method of any one of clauses 1-4, wherein the plurality of channels comprises between 5 channels and 10,000 channels across the nanostructure.

Clause 6. The method of any one of clauses 1-5, wherein a center to center distance between each channel and a neighboring channel in the plurality of channels is between 100 nm and 500 nm.

Clause 7. The method of any one of clauses 1-5, wherein a center to center distance between each channel and a neighboring channel in the plurality of channels is between 500 nm and 1 mm.

Clause 8. The method of any one of clauses 1-7, the method further initiating a flow of gas or liquid through the plurality of channels thereby causing the plurality of channels to transition from a zero-volume state to an inflated state.

Clause 9. The method of clause 8, the method further comprising halting the flow of gas or liquid through the plurality of channels thereby causing the plurality of channels to transition from the inflated state to the zero-volume state.

Clause 10. The method of clause 9, wherein the initiation and halting is repeated in accordance with a set of instructions to affect the texture of the nanostructure over time in a manner specified by the set of instructions.

Clause 11. The method of any one of clauses 8-10, wherein the plurality of channels each have a height of less than 50 nanometer in the zero-volume state and a height of greater than 50 nanometers in the inflated state.

Clause 12. The method of any one of clauses 8-10, wherein the plurality of channels each have a height of less than 50 nanometer in the zero-volume state and a height of between 50 nanometers and 500 nanometers in the inflated state.

Clause 13. The method of any one of clauses 1-12, wherein the first and second resin mixture each independently comprises a multifunctional acrylate monomer or oligomer, a multifunctional thiol, and a base catalyst.

Clause 14. The method of any one of clauses 1-13, wherein the additional monomer or oligomer is a multifunctional allyl ether terminated monomer or oligomer.

In some embodiments of any one of clauses 1-14, curing of a resin mixture affords an adduct of general formula:

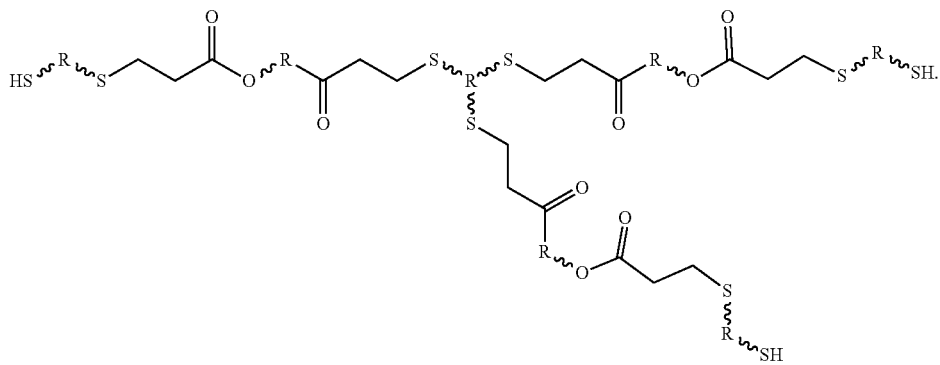

In some embodiments, of any of clauses 1-14, exposure to a first actinic radiation, a second actinic radiation, or a third actinic radiation affords an adduct of general formula:

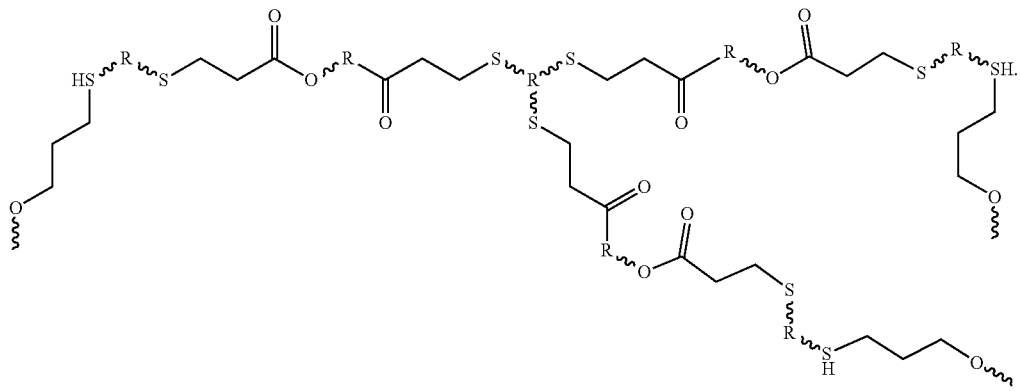

Clause 15. A B-stage thiol-cured urethane acrylate elastomeric nanostructure comprising a first thiol terminated B-stage elastomer film and a second thiol terminated B-stage elastomer film, wherein: the first film comprises a first plurality of repeating respective first and second regions, wherein each respective first region is cured but not bonded and each respective second region is cured and bonded; the second film comprises a second plurality of repeating respective third and fourth regions, wherein each respective third region is cured but not bonded and each respective fourth region is cured and bonded; a first face of the first film is sandwiched to a first face of the second film with each respective second region aligned with a corresponding fourth region thereby forming a plurality of channels that run across the nanostructure with a pitch between respective channels in the plurality of channels that is between 100 nm and 1 mm; and the plurality of channels are adjustable, responsive to a change in gas pressure or liquid flow within the plurality of channels, between a zero-volume state and an inflated state.

Clause 16. The B-stage thiol-cured urethane acrylate elastomeric nanostructure of clause 15, wherein the plurality of channels comprises between 5 channels and 10,000 channels across the nanostructure.

Clause 17. The B-stage thiol-cured urethane acrylate elastomeric nanostructure of clause 15 or 16, wherein a center to center distance between each channel and a neighboring channel in the plurality of channels is between 100 nm and 500 nm.

Clause 18. The B-stage thiol-cured urethane acrylate elastomeric nanostructure of clause 15 or 16, wherein a center to center distance between each channel and a neighboring channel in the plurality of channels is between 500 nm and 1 mm.

Clause 19. The B-stage thiol-cured urethane acrylate elastomeric nanostructure of any one of clauses 15-18, wherein the plurality of channels each have a height of less than 50 nanometer in the zero-volume state and a height of greater than 50 nanometers in the inflated state.

Clause 20. The B-stage thiol-cured urethane acrylate elastomeric nanostructure of any one of clauses 15-18, wherein the plurality of channels each have a height of less than 50 nanometer in the zero-volume state and a height of between 50 nanometers and 500 nanometers in the inflated state.

Clause 21. A fluidically actuated haptic display comprising the B-stage thiol-cured urethane acrylate elastomeric nanostructure of any one of clauses 15-20.

Clause 22. A customizable surface texture comprising the B-stage thiol-cured urethane acrylate elastomeric nanostructure of any one of clauses 15-20.

Clause 23. A tunable physical bonding material comprising the B-stage thiol-cured urethane acrylate elastomeric nanostructure of any one of clauses 15-20.

Clause 24. A tunable optical display comprising the B-stage thiol-cured urethane acrylate elastomeric nanostructure of any one of clauses 15-20.

In some embodiments of any one of clauses 15-24, a B-stage thiol-cured urethane acrylate elastomeric nanostructure comprises an adduct of general formula:

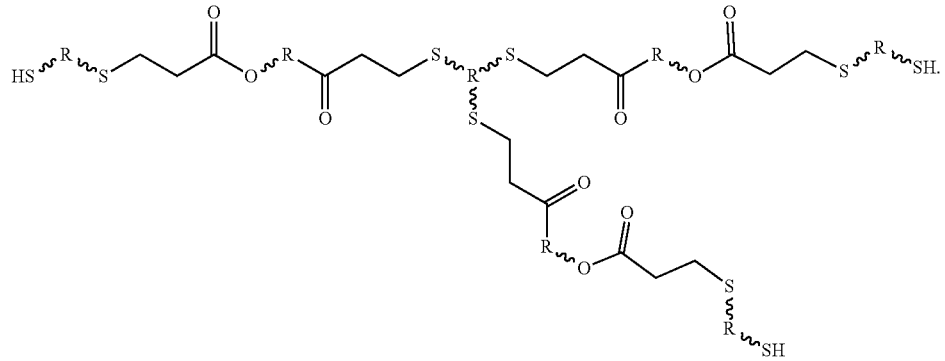

In some embodiments of any one of clauses 15-24, a B-stage thiol-cured urethane acrylate elastomeric nanostructure comprises an adduct of general formula:

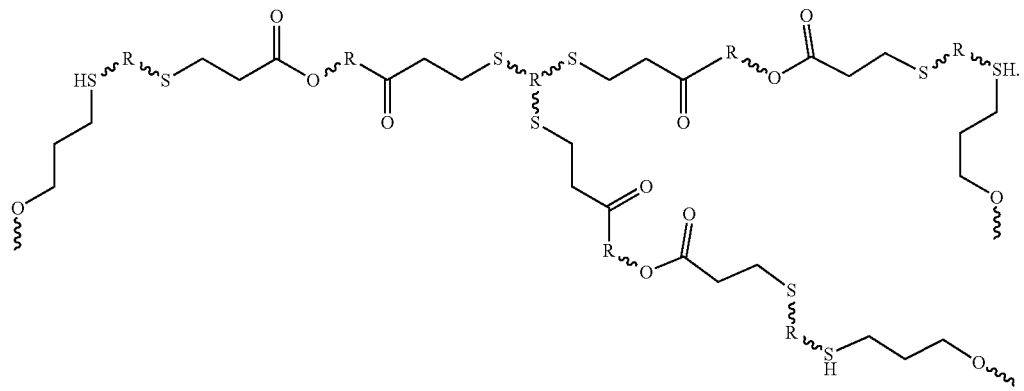

Clause 25. A method of making a B-stage cured elastomeric nanostructure comprising a first polymerizable or crosslinkable functional groups terminated B-stage elastomer film and a second polymerizable or crosslinkable functional groups terminated B-stage elastomer film, the method comprising: curing a first resin mixture comprising one or more monomers or oligomers spin coated on a first substrate, thereby forming the first film; coating a resist on an exposed face of the first film; patterning the resist to form a repeating pattern of resist across the first film; curing a second resin mixture comprising one or more monomers or oligomers on the first face of the first film, thereby forming the second film; exposing the first and second film to a first actinic radiation; dissolving the repeating pattern of resist to form a plurality of channels within the second film that run across the nanostructure with a pitch between respective channels in the plurality of channels that is between 100 nm and 1 mm; wherein the one or more monomers or oligomers in the first and second resin mixture comprise a plurality of first polymerizable or crosslinkable functional groups, and a plurality of second polymerizable or crosslinkable functional groups, wherein the stoichiometric ratio between the first polymerizable or crosslinkable functional groups and the second polymerizable or crosslinkable functional groups is between about 1.15:1 and about 1:1.15.

Clause 26. The method of clause 25, wherein the plurality of channels comprises between 5 channels and 10,000 channels across the nanostructure.

Clause 27. The method of clause 25 or 26, wherein a center to center distance between each channel and a neighboring channel in the plurality of channels is between 100 nm and 500 nm.

Clause 28. The method of clause 25 or 26, wherein a center to center distance between each channel and a neighboring channel in the plurality of channels is between 500 nm and 1 mm.

Clause 29. The method of any one of clauses 25-28, the method further initiating a flow of gas or liquid through the plurality of channels thereby causing the plurality of channels to transition from a zero-volume state to an inflated state.

Clause 30. The method of clause 29, the method further comprising halting the flow of gas or liquid through the plurality of channels thereby causing the plurality of channels to transition from inflated channels to zero-volume channels.

Clause 31. The method of clause 30, wherein the initiation and halting is repeated in accordance with a set of instructions to affect the texture of the nanostructure over time in a manner specified by the set of instructions.

Clause 32. The method of any one of clauses 29-31, wherein the plurality of channels each have a height of less than 50 nanometer in the zero-volume state and a height of greater than 50 nanometers in the inflated state.

Clause 33. The method of any one of clauses 29-31, wherein the plurality of channels each have a height of less than 50 nanometer in the zero-volume state and a height of between 50 nanometers and 500 nanometers in the inflated state.

Clause 34. The method of any one of clauses 25-33, wherein the first and second resin mixture each independently comprises a multifunctional acrylate monomer or oligomer, a multifunctional thiol, and a base catalyst.

Clause 35. The method of any one of clauses 25-33, wherein the polymerizable or crosslinkable functional group is a thiol group.

In some embodiments of any one of clauses 25-35, curing of a resin mixture affords an adduct of general formula:

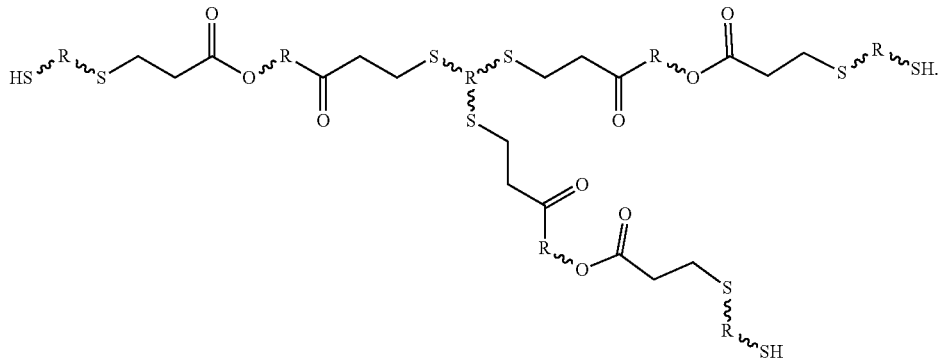

In some embodiments, of any of clauses 25-35, exposure to an actinic radiation affords an adduct of general formula:

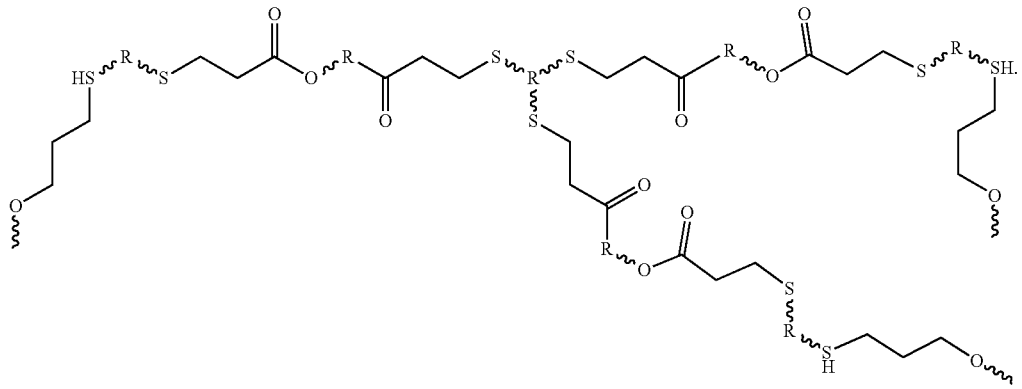

Clause 36. A B-stage polymerizable or crosslinkable functional group cured elastomeric nanostructure comprising a first polymerizable or crosslinkable functional group terminated B-stage elastomer film and a second polymerizable or crosslinkable functional group terminated B-stage elastomer film, wherein: the first film comprises a plurality of channels that run across the nanostructure with a pitch between respective channels in the plurality of channels that is between 100 nm and 1 mm; a first face of the first film is sandwiched to a first face of the second film; and the plurality of channels are adjustable, responsive to a change in gas pressure or liquid flow within the plurality of channels, between a zero-volume state and an inflated state.

Clause 37. The B-stage polymerizable or crosslinkable functional group cured elastomeric nanostructure of clause 36, wherein the plurality of channels comprises between 5 channels and 10,000 channels across the nanostructure.

Clause 38. The B-stage polymerizable or crosslinkable functional group cured elastomeric nanostructure of clause 36 or 37, wherein a center to center distance between each channel and a neighboring channel in the plurality of channels is between 100 nm and 500 nm.

Clause 39. The B-stage polymerizable or crosslinkable functional group cured elastomeric nanostructure of clause 36 or 37, wherein a center to center distance between each channel and a neighboring channel in the plurality of channels is between 500 nm and 1 mm.

Clause 40. The B-stage polymerizable or crosslinkable functional group cured elastomeric nanostructure of any one of clauses 36-39, wherein the plurality of channels each have a height of less than 50 nanometer in the zero-volume state and a height of greater than 50 nanometers in the inflated state.

Clause 41. The B-stage polymerizable or crosslinkable functional group cured elastomeric nanostructure of any one of clauses 36-39, wherein the plurality of channels each have a height of less than 50 nanometer in the zero-volume state and a height of between 50 nanometers and 500 nanometers in the inflated state.

Clause 42. The B-stage polymerizable or crosslinkable functional group cured elastomeric nanostructure of any one of clauses 36-41, wherein the polymerizable or crosslinkable functional group is a thiol group.

Clause 43. The B-stage polymerizable or crosslinkable functional group cured elastomeric nanostructure of any one of clauses 36-42, wherein B-stage polymerizable or crosslinkable functional group cured elastomeric nanostructure is a B-stage thiol-cured urethane acrylate elastomeric nanostructure.

Clause 44. A fluidically actuated haptic display comprising the B-stage polymerizable or crosslinkable functional group cured elastomeric nanostructure of any one of clauses 32-37.

Clause 45. A customizable surface texture comprising the B-stage polymerizable or crosslinkable functional group cured elastomeric nanostructure of any one of clauses 32-37.

Clause 46. A tunable physical bonding material comprising the B-stage polymerizable or crosslinkable functional group cured elastomeric nanostructure of any one of clauses 32-37.

Clause 47. A tunable optical display comprising the B-stage polymerizable or crosslinkable functional group cured elastomeric nanostructure of any one of clauses 32-37.

In some embodiments of any one of clauses 36-47, a B-stage polymerizable or crosslinkable functional group cured elastomeric nanostructure comprises an adduct of general formula:

described herein unless incompatible therewith. Thus, such features may be used where appropriate in conjunction with any of the definition, clauses, claims or embodiments defined herein. All of the features disclosed in this specification (including any accompanying claims, abstract and drawings), and/or all of the steps of any method or process so disclosed, may be combined in any combination, except combinations where at least some of the features and/or steps are mutually exclusive. The present disclosure is not restricted to any details of any disclosed embodiments. The present disclosure extends to any novel one, or novel combination, of the features disclosed in this specification (including any accompanying claims, abstract and drawings), or to any novel one, or any novel combination, of the steps of any method or process so disclosed.

CONCLUSION

While preferred embodiments are shown and described herein, such embodiments are provided by way of example only and are not intended to otherwise limit the scope of the

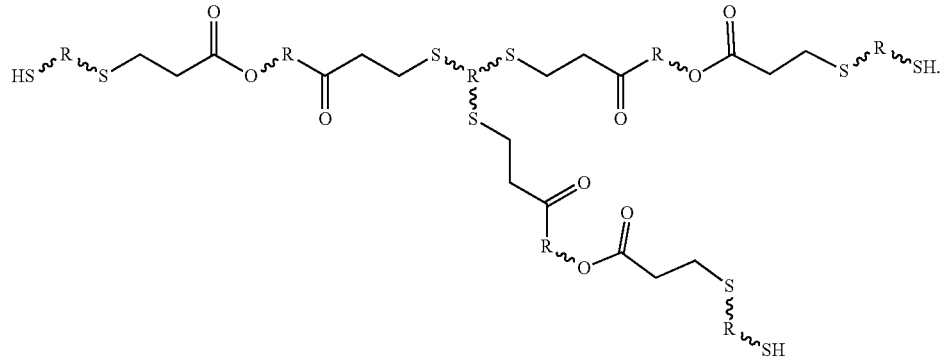

In some embodiments of any one of clauses 36-47, a B-stage polymerizable or crosslinkable functional group cured elastomeric nanostructure comprises an adduct of general formula:

disclosure. Various alternatives to the described embodiments may be employed in practicing the disclosure.

A number of patent and non-patent publications are cited herein in order to describe the state of the art to which this

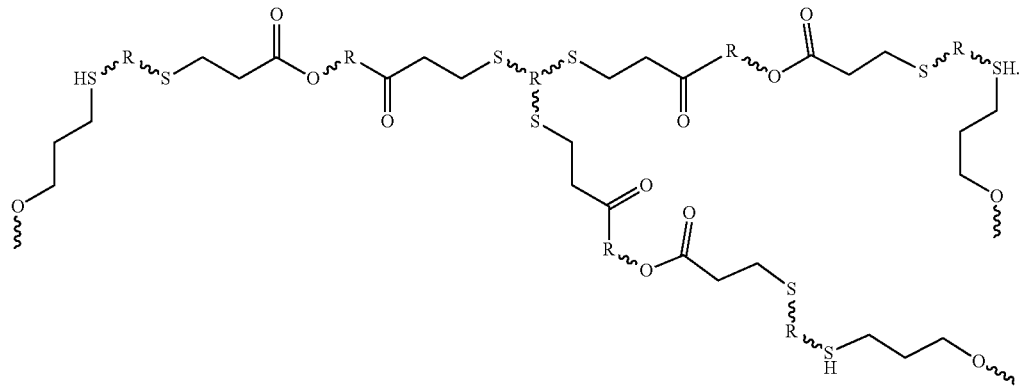

For the avoidance of doubt, it is intended herein that particular features (for example integers, characteristics, values, uses, diseases, formulae, compounds or groups) described in conjunction with a particular aspect, embodiment or example of the disclosure are to be understood as applicable to any other aspect, embodiment or example disclosure pertains. The entire disclosure of each of these publications is incorporated by reference herein.

While certain embodiments are described and/or exemplified herein, various other embodiments will be apparent to those skilled in the art from the disclosure. The present disclosure is, therefore, not limited to the particular embodi-

What is claimed:

1. A method of making a B-stage thiol-cured urethane acrylate elastomeric nanostructure comprising a first thiol terminated B-stage elastomer film and a second thiol terminated B-stage elastomer film, the method comprising:
curing a combination of a first resin mixture comprising one or more monomers or oligomers on a first substrate to form the first film;
overlaying a first patterned mask on the first film, wherein the first patterned mask defines a first repeating pattern;
exposing the first film to a first actinic radiation in the presence of an additional monomer or oligomer thereby transferring the first repeating pattern to the first film as a first plurality of repeating respective first and second regions, wherein each respective first region corresponds to a portion of the first film shielded from the actinic radiation during actinic radiation exposure by the first patterned mask and each respective second region corresponds to a portion of the first film exposed to the actinic radiation;
curing a combination of a second resin mixture comprising one or more monomers or oligomers on a second substrate to form the second film;
overlaying a second patterned mask on the second film, wherein the second patterned mask defines a second repeating pattern;
exposing the second film to a second actinic radiation in the presence of an additional monomer or oligomer thereby transferring the second repeating pattern to the second film as a second plurality of repeating respective third and fourth regions within the second film, wherein each respective third region corresponds to a portion of the second film masked from the actinic radiation by the second mask and each respective fourth region corresponds to a portion of the second film exposed to the actinic radiation;
sandwiching a first exposed face of the first film to a first exposed face of the second film with each respective second region aligned with a corresponding fourth region, thereby forming a plurality of channels that run across the nanostructure with a pitch between respective channels in the plurality of channels that is between 100 nm and 1 mm;
removing the second substrate thereby exposing a second face of the first film; and
exposing the second face of the first film to a third actinic radiation thereby bonding the first film to the second film through the respective first regions bonding to the respective third regions by the third actinic radiation, wherein
the one or more monomers or oligomers in the first and second resin mixture comprise a plurality of first polymerizable or crosslinkable functional groups, and a plurality of second polymerizable or crosslinkable functional groups, wherein the stoichiometric ratio between the first polymerizable or crosslinkable functional groups and the second polymerizable or crosslinkable functional groups is between about 1.15:1 and about 1:1.15.

2. The method of claim 1, further comprising removing the second substrate.

3. The method of claim 1, wherein the first substrate and the second substrate are each made of silicon.

4. The method of claim 1, wherein the first substrate or the second substrate is optically transparent.

5. The method of claim 1, wherein the plurality of channels comprises between 5 channels and 10,000 channels across the nanostructure.

6. The method of claim 1, wherein a center to center distance between each channel and a neighboring channel in the plurality of channels is between 100 nm and 500 nm.

7. The method of claim 1, wherein a center to center distance between each channel and a neighboring channel in the plurality of channels is between 500 nm and 1 mm.

8. The method of claim 1, the method further initiating a flow of gas or liquid through the plurality of channels thereby causing the plurality of channels to transition from a zero-volume state to an inflated state.

9. The method of claim 8, the method further comprising halting the flow of gas or liquid through the plurality of channels thereby causing the plurality of channels to transition from the inflated state to the zero-volume state.

10. The method of claim 9, wherein the initiation and halting is repeated in accordance with a set of instructions to affect the texture of the nanostructure over time in a manner specified by the set of instructions.

11. The method of claim 8, wherein the plurality of channels each have a height of less than 50 nm in the zero-volume state and a height of greater than 50 nm in the inflated state.

12. The method of claim 8, wherein the plurality of channels each have a height of less than 50 nm in the zero-volume state and a height of between 50 nm and 500 nm in the inflated state.

13. The method of claim 1, wherein the first and second resin mixture each independently comprises a multifunctional acrylate monomer or oligomer, a multifunctional thiol, and a base catalyst.

14. The method of claim 1, wherein the additional monomer or oligomer is a multifunctional allyl ether terminated monomer or oligomer.

15. A B-stage thiol-cured urethane acrylate elastomeric nanostructure comprising a first thiol terminated B-stage elastomer film and a second thiol terminated B-stage elastomer film, wherein:
the first film comprises a first plurality of repeating respective first and second regions, wherein each respective first region is cured but not bonded and each respective second region is cured and bonded;
the second film comprises a second plurality of repeating respective third and fourth regions, wherein each respective third region is cured but not bonded and each respective fourth region is cured and bonded;
a first face of the first film is sandwiched to a first face of the second film with each respective second region aligned with a corresponding fourth region thereby forming a plurality of channels that run across the nanostructure with a pitch between respective channels in the plurality of channels that is between 100 nm and 1 mm; and
the plurality of channels are adjustable, responsive to a change in gas pressure or liquid flow within the plurality of channels, between a zero-volume state and an inflated state.

16. The B-stage thiol-cured urethane acrylate elastomeric nanostructure of claim 15, wherein the plurality of channels comprises between 5 channels and 10,000 channels across the nanostructure.

17. The B-stage thiol-cured urethane acrylate elastomeric nanostructure of claim 15, wherein a center to center distance between each channel and a neighboring channel in the plurality of channels is between 100 nm and 500 nm.

18. The B-stage thiol-cured urethane acrylate elastomeric nanostructure of claim 15, wherein a center to center distance between each channel and a neighboring channel in the plurality of channels is between 500 nm and 1 mm.

19. The B-stage thiol-cured urethane acrylate elastomeric nanostructure of claim 15, wherein the plurality of channels each have a height of less than 50 nanometer in the zero-volume state and a height of greater than 50 nanometers in the inflated state.

20. A method of making a B-stage cured elastomeric nanostructure comprising a first polymerizable or crosslinkable functional groups terminated B-stage elastomer film and a second polymerizable or crosslinkable functional groups terminated B-stage elastomer film, the method comprising:
- curing a first resin mixture comprising one or more monomers or oligomers spin coated on a first substrate, thereby forming the first film;
- coating a resist on an exposed face of the first film;
- patterning the resist to form a repeating pattern of resist across the first film;
- curing a second resin mixture comprising one or more monomers or oligomers on the first face of the first film, thereby forming the second film;
- exposing the first and second film to a first actinic radiation; and
- dissolving the repeating pattern of resist to form a plurality of channels within the second film that run across the nanostructure with a pitch between respective channels in the plurality of channels that is between 100 nm and 1 mm; wherein the one or more monomers or oligomers in the first and second resin mixture comprise a plurality of first polymerizable or crosslinkable functional groups, and a plurality of second polymerizable or crosslinkable functional groups, wherein the stoichiometric ratio between the first polymerizable or crosslinkable functional groups and the second polymerizable or crosslinkable functional groups is between about 1.15:1 and about 1:1.15.

* * * * *